United States Patent [19]

Miller

[11] 4,411,731
[45] Oct. 25, 1983

[54] METHOD OF CONTOURING CRYSTAL PLATES

[75] Inventor: Anton J. Miller, Allentown, Pa.

[73] Assignee: Bell Telephone Laboratories, Incorporated, Murray Hill, N.J.

[21] Appl. No.: 453,348

[22] Filed: Dec. 27, 1982

[51] Int. Cl.³ .................. B44C 1/22; C03C 15/00; C03C 25/06
[52] U.S. Cl. ................... 156/630; 156/631; 156/655; 156/663
[58] Field of Search ............ 156/630, 633, 645, 655, 156/657, 662, 663, 631, 668; 252/79.3

[56] References Cited

U.S. PATENT DOCUMENTS 3,864,111 2/1975 Kemp ........................... 156/663 X
3,951,728 4/1976 Egashira et al. ............. 156/651 X Primary Examiner—William A. Powell
Attorney, Agent, or Firm—Lester H. Birnbaum

[57] ABSTRACT

A method of contouring crystal plates for frequency control. After plate dimensions are established, the plates are kept in a stack separated by a bonding material. The stack is immersed in an etchant which etches the exposed crystal edges in a manner which undercuts the bonding material, thus batch forming bevel contours on at least the outer portions of the major faces of each plate in the stack.

10 Claims, 9 Drawing Figures

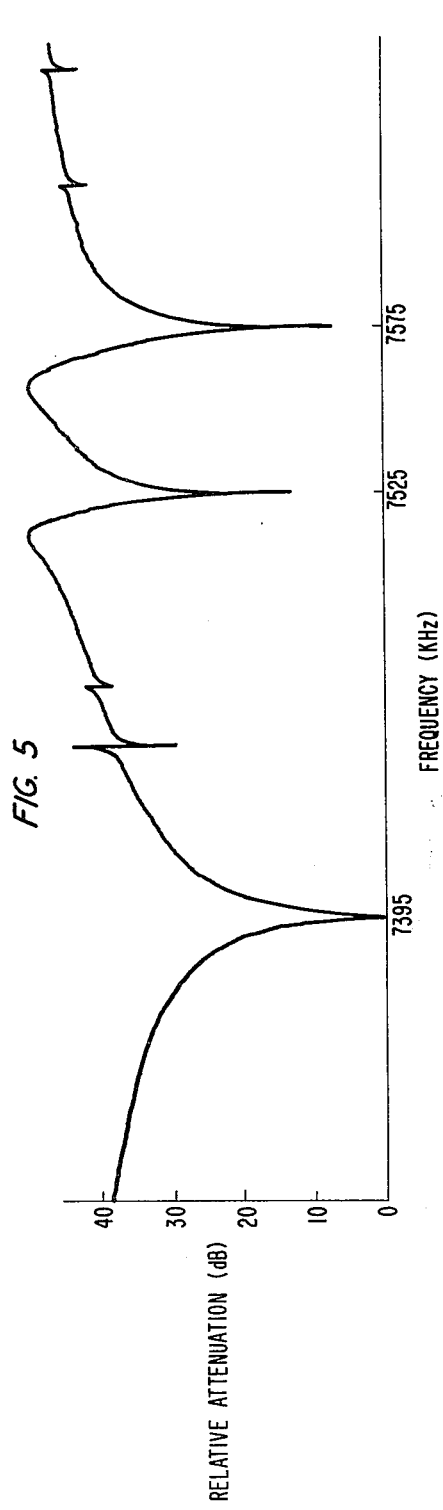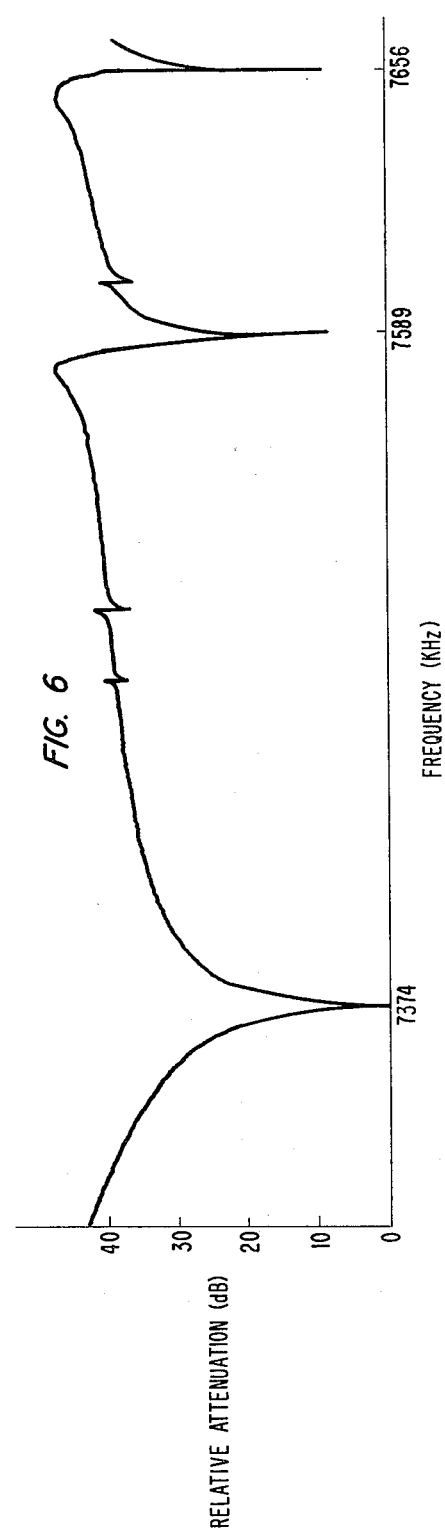

METHOD OF CONTOURING CRYSTAL PLATES

BACKGROUND OF THE INVENTION

This invention relates to fabrication of piezoelectric devices which include crystal plates, and in particular to a method for contouring the crystal plates.

Resonators and filters employing crystal plates, typically quartz, have been in use for many years. Such devices rely on the vibrational response of the plate to an electrical bias supplied by means of electrodes formed on the surfaces of the plates. In many applications, it is desirable to contour the edges of the plates after defining the plate dimensions in order to achieve optimum frequency control and vibrational activity. The need is especially acute for small plates where the aspect ratio (length or diameter to thickness ratio) is low (typically below 50 for AT-cut quartz) since it is difficult to otherwise confine vibration under the electrodes.

Presently, contouring is usually done mechanically by either optical lens-type grinding of individual plates or "pipe contouring" where several plates are inserted in a rotating pipe. The lens-type grinding is precise but also very costly. Pipe contouring is advantageous for crystal units requiring less precision, but it is difficult to pipe contour small plates (diameter, length or width dimensions of less than 0.3 inches) and the process is limited to relatively thick circular or square plates.

It is therefore a primary object of the invention to provide a method of batch-contouring crystal plates which can be utilized on small or thin plates and plates having a vriety of shapes.

SUMMARY OF THE INVENTION

This and other objectives are achieved in accordance with the invention which is a method of fabricating piezoelectric devices which include crystal plates. The method comprises the steps of providing a stack of plates separated by a bonding material and contouring portions of such plates by immersing the stack in an etchant which dissolves the bonding material and etches the exposed portions of the plates.

BRIEF DESCRIPTION OF THE DRAWING

These and other features of the invention are delineated in detail in the following description.

In the drawing:

FIGS. 5 and 6 are graphs of plate activity as a function of frequency for two different plates fabricated in accordance with one embodiment of the invention;

It will be appreciated that for purposes of illustration these figures are not necessarily drawn to scale.

DETAILED DESCRIPTION

In a typical sequence of forming plates from a quartz crystal block, the block is cut into sections and then sawed into wafers of the desired crystal orientation. Each wafer is ground, lapped or polished to the desired thickness and a number of wafers are stacked and bonded together by a suitable material. The stacked plates are then ground or lapped to the approximate desired lateral dimensions (diameter or length and width).

Figure 1:
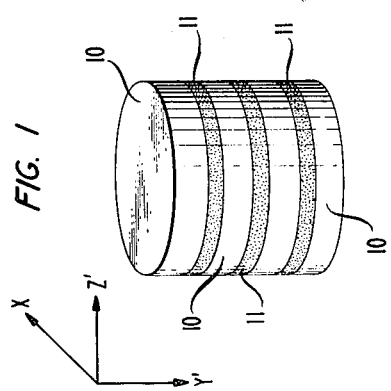
FIG. 1 is a perspective view of a portion of a stack of crystal plates during one stage of fabrication in accordance with one embodiment of the invention.

FIG. 1 illustrates a stack of crystal plates, 10, at this stage in the processing. The x, y, and z axes are shown approximately in the FIGURE. It will be noted that the plates in this example are circular in the x-z plane. However, one of the advantages of the invention is the fact that it can be utilized with square, rectangular or other shapes of plates. It will be appreciated that only a portion of a stack is shown for illustrative purposes, and a typical stack would include up to 100 plates. In this example, the crystal plates had an AT-cut orientation but the invention should be applicable regardless of the crystal orientation. The diameter of the plates in this example was approximately 0.30 inches and the thickness of each plate was approximately 0.009 inches.

The plates, 10, were batch bonded to each other by layers of bonding material, 11. In a preferred embodiment of the invention, for reasons discussed later, the bonding material comprises beeswax as its major ingredient. In this particular example, the bonding wax comprised approximately 50–60% of long chain esters (beeswax), and the remainder was wood resin (apietic acids) and hydrocarbon waxes with chain lengths larger than $C_{17}$, the larger fraction of the hydrocarbon waxes having a chain length greater than $C_{25}$. A dye was also included. The thickness of the bonding material was approximately 0.002 inches, and will generally range from 0.0001–0.003 inches in thickness.

Figure 3:
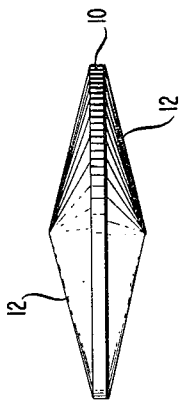
FIG. 3 is a side view of one of the crystal plates at another stage of fabrication in accordance with an alternative embodiment.

In accordance with a main feature of the invention, the plates were then contoured by inserting the stack in a suitable chemical etchant. The etchant is chosen so that it dissolves the bonding layer in a controlled manner and etches the exposed plate surfaces. As shown in FIG. 1, this will produce a double-bevel contour on the outer portion, 12, of the major surfaces of each plate while leaving a flat portion, 13, at the center. Although leaving a flat portion is generally suitable for most applications, a stack may also be etched until the etchant reaches the center of the plates as shown in FIG. 3. The diameter of the plates will also be reduced, but this effect is minimal (typically less than 1% reduction).

In this particular example, the etchant was a 49% solution of hydrofluoric acid at room temperature (25° C.). However, any etchant which dissolves the bonding material while etching the exposed plate surfaces should be applicable. Most etchants containing fluoride, for example, would appear to be practical alternatives. Any standard bonding material used for stacking crystal plates could probably be used, although the material described in this example is preferred due to its uniform flow when stacking the plates and its uniform etching characteristics. It will be appreciated that the rate of etching can be varied to achieve shallower or steeper contours by, for example, changing the quantity of hydrocarbon waxes or adding thermoplastic resins (e.g., polyvinyl, polyethylene or shellac) to the material described in this example.

For a desired degree of contour, the amount of time the stack should be immersed in the etchant will vary according to the etchant used (type, concentration, temperature), the bonding material, and the surface finish of the plate. Thus, time should be determined for each particular need. In the example shown in FIG. 2, the time of immersion was approximately 15½ hours. This produced a flat portion, 13, which was either 0.130 inches or 0.185 inches for each plate in the stack depending upon the abrasive used to lap the two major faces of the plates prior to forming the stack and contouring. A faster etch will result when the abrasive has a large grain size due to the resulting larger surface area of the plate. In this example, aluminum oxide abrasives having grain sizes of 5 $\mu$m and 12 $\mu$m were used and accounted for the different results for the stacks previously mentioned. It is expected that exposure of the plates to the etchant will usually fall within the range 3–25 hours.

Subsequent to the contouring, the plates can be separated by immersion of the stack in a solvent which dissolves the wax, such as trichlorethylene vapor degreaser, for a few minutes.

Several methods are available to determine the point at which a desired contour is reached. This can be done during processing, for example, by mechanically or optically measuring the size of the unetched portion. Alternatively, contouring may be sample tested optically by unstacking one or several plates, positioning these plates between two crossed polaroids, shining white light through the plates and polaroids, observing the obtained equal thickness fringes typical for light retardation in birefringent crystals under this condition, and comparing the colors of the fringes to some calibrated crystal.

Figure 4:
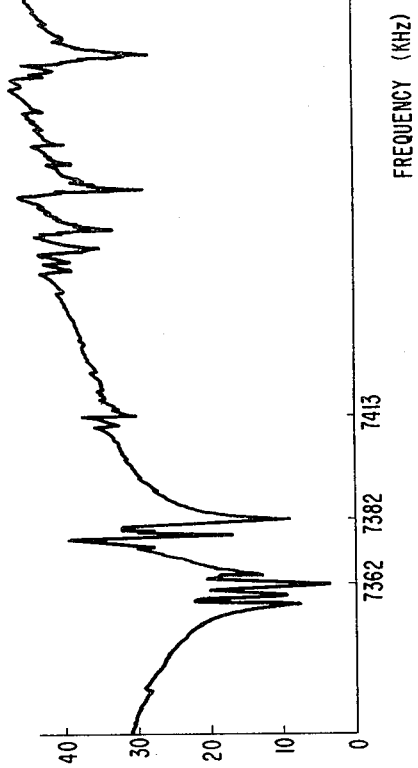
FIG. 4 is a graph of plate activity as a function of frequency for an uncontoured plate.

A further method is to determine the degree of contour piezoelectrically by measuring mode spacing between, for example, the fundamental thickness shear and inharmonic modes of a crystal plate during processing or of a completed crystal plate by an arrangement using a spectrum analyzer or oscillator. FIG. 4 shows the mode spectrum of an uncontoured plate while FIGS. 5–6 show the mode spectrum of plates from two different stacks contoured in accordance with the invention. Measurements essentially involved placing a plate between two electrodes separated from each other by a distance of approximately 0.002 inches more than the thickness of the plate, connecting the electrodes to a properly terminated half lattice bridge, applying a signal of varying frequencies from a spectrum analyzer and recording the activities and frequencies of the natural plate modes over an appropriate frequency range.

FIG. 4 shows the resulting plot of a mode spectrum for an uncontoured flat plate with a diamter of 0.420 inches, which corresponds to an aspect ratio of 47. It will be noted that due to the relatively large activities of the parasitic modes (expressed in terms of attenuation), the wanted thickness shear and related inharmonic modes cannot be determined accurately. FIGS. 5 and 6 illustrate how contouring suppresses the parasitic modes by confining the vibrational energy of the desired modes to the center of the plate and so enhancing their activities. It is characteristic of contouring that it also increases the spacings between the thickness shear and the inharmonic modes as the contouring increases. Both figures show results from plates with diameters of 0.300 inches, which correspond to an aspect ratio of 33. In both cases, the stacks were immersed for a time of 15½ hours. In the FIG. 5 example, however, a flat portion of 0.185 inches was produced and in the FIG. 6 example, a 0.130 inches flat portion resulted.

In both cases, the thickness shear and inharmonic modes are now easily identified. In the FIG. 5 example, the fundamental thickness shear mode was at 7395 kHz and the first pronounced inharmonic mode at 7525 kHz. In the FIG. 6 example, the fundamental thickness shear mode occurred at 7374 kHz and the first pronounced inharmonic at 7589 kHz. The mode spacing in the FIG. 5 example was, therefore, 1.75% while that of the FIG. 6 example was 2.91%. Thus, the effective contour or the contouring time needed for a particular application can be determined for particular etchants and surface finishes on the basis of a desired mode spacing.

Figure 7:
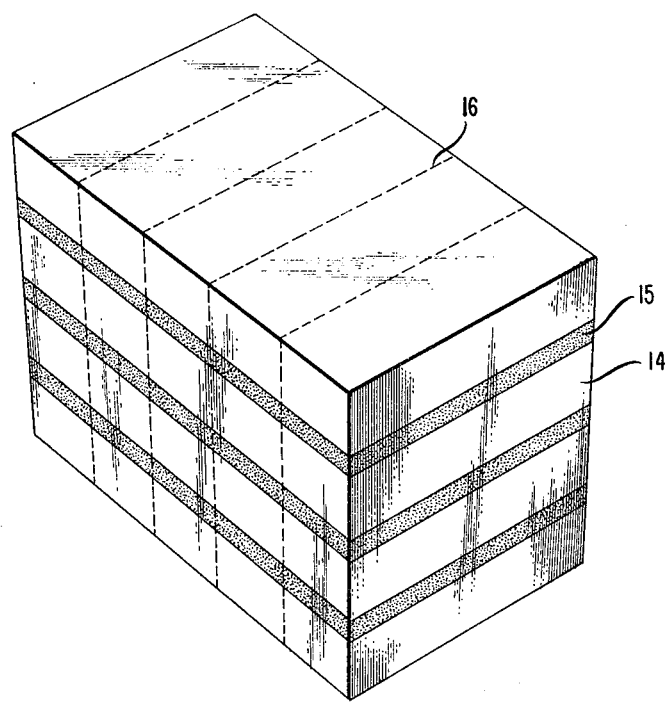
FIG. 7 is a perspective view of a portion of a stack of crystal plates during one stage of fabrication in accordance with a further embodiment of the invention.

Although the above examples describe use of circular plates, experiments utilizing rectangular plates have demonstrated similar results. For example, as shown in FIG. 7, a stack of rectangular plates, 14 were bonded together by a bonding material, 15, which was the same as the previous example. The stack was contoured in accordance with the invention by immersion in the etchant previously described and then formed into smaller stacks by cutting along dashed lines 16. After dissolving the remaining wax as previously described, individual rectangular plates with double-bevel contours only along the smaller (width) dimension were obtained.

Figure 8:
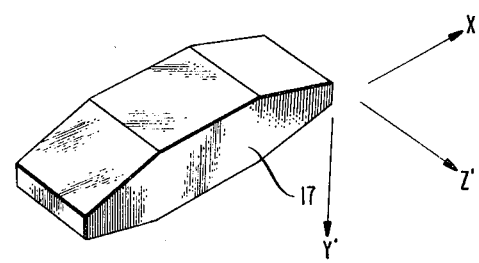
FIG. 8 is a perspective view of one of the crystal plates cut from the stack of FIG. 7 at another stage of fabrication in accordance with one embodiment of the invention.

In one example, the original plates in the stack had a longer dimension of 1.5 inches in the z' direction, a narrower dimension of 0.366 in the x direction, and a thickness of 0.160 inches in the y' direction. After immersion in the etchant for approximately 14 hours, cutting along the x direction and dissolving the remaining wax, a plate such as that shown in FIG. 8 resulted. The plate, therefore, had a length (x direction) of 0.366 inches, a width (z' direction) of 0.050 inches and a thickness (y' direction) of 0.016 inches. The uncontoured center portion was approximately 0.160 inches in length. The plates had a fundamental thickness shear mode of 4130 kHz and a mode spacing of 5.37%. The abrasive used to lap the initial plates before contouring had a grain size of 12 $\mu$m.

In another example, the same procedure was followed except that the initial plates, 14, had a longer dimension in the x direction and a narrower dimension in the z' direction of 1.5×0.301 inches. After cutting along the z' direction and dissolving the wax, plates such as that shown in FIG. 9, designated 18, resulted with a width (x direction) of 0.048 inches, a length (z' direction) of 0.301 inches and a thickness (y' direction) of 0.016 inches. The uncontoured center portion measured approximately 0.107 inches in length. Such plates had a fundamental thickness shear mode at 4200 kHz and a mode spacing of 2.2%. If desired, the surface of the rectangular plates could be fully contoured with no flat portion in the length dimension similar to that shown in FIG. 3.

Figure 9:
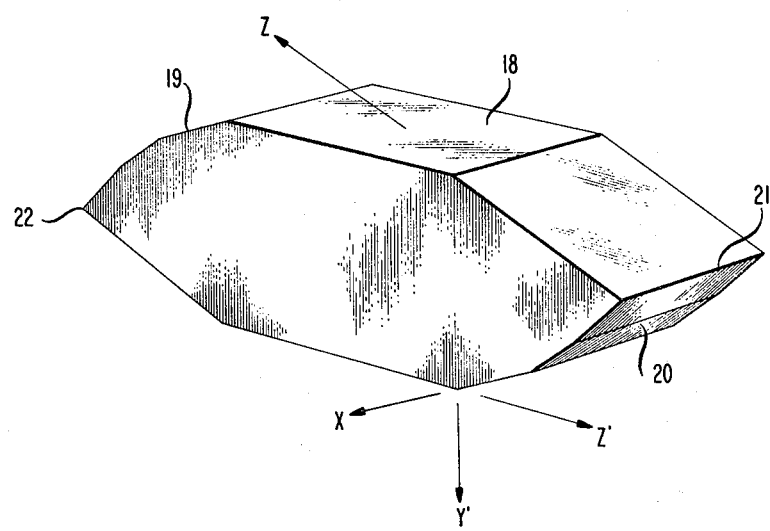
FIG. 9 is a perspective view of one of the crystal plates cut from the stack of FIG. 7 at another stage of fabrication in accordance with a further embodiment.

It will be noted in FIG. 9, that, due to the etching character of quartz in the z' direction, two of the four contoured surfaces, designated 19 and 20, have more than one bevel and produce sharp edges 21 and 22 at the ends of the plates. (The approximate position of the z axis of the crystal is illustrated.) This reduced thickness of the edges is advantageous since the plates can be contacted there for mounting in the final device and provide less loss of vibrational energy than larger, flat-edged surfaces.

Various modifications of the invention will become apparent to those skilled in the art. All such variations which basically rely on the teachings through which the invention has advanced the art are properly considered within the spirit and scope of the invention.

What is claimed is:

1. A method of fabricating piezoelectric devices which include crystal plates comprising the steps of providing a stack of such plates separated by a bonding material, and contouring such plates by immersing the stack in an etchant which dissolves the bonding material and etches the exposed portions of the plates.

2. The method according to claim 1 wherein the bonding material comprises beeswax.

3. The method accordig to claim 1 wherein the etchant comprises a fluoride.

4. The method according to claim 3 wherein the etchant comprises hydrofluoric acid.

5. The method according to claim 1 wherein the etchant produces a bevel contour on the outer portions of both major surfaces of the plates.

6. The method according to claim 1 wherein the aspect ratio of the plates is less than 50.

7. The method according to claim 1 wherein the etchant produces a bevel contour over the entire major surfaces of the plates.

8. The method according to claim 1 wherein the stack is immersed in the etchant for a time of 3-25 hours.

9. The method according to claim 1 where the major surfaces of the plates are rectangular and the etchant produces a multi-bevel contour on at least one outer portion of both major surfaces and a sharp edge between the major surfaces.

10. A method of adjusting the frequency response of piezoelectric crystal plates having an aspect ratio less than 50 comprising the steps of providing a stack of such plates separated by a bonding material comprising beeswax, and contouring outer portions of the major surfaces of such plates by immersing the stack in an etchant comprising hydrofluoric acid which slowly dissolves the bonding material and etches the exposed portions of the plates to produce a bevel contour at an outer portion of the major surfaces of each plate.

* * * * *

UNITED STATES PATENT AND TRADEMARK OFFICE
CERTIFICATE OF CORRECTION

PATENT NO. : 4,411,731

DATED : October 25, 1983

INVENTOR(S) : Anton J. Miller

Figure 2:
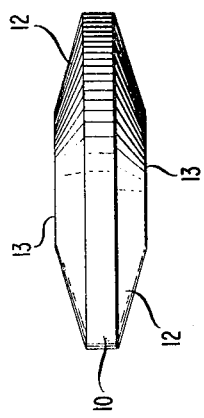
FIG. 2 is a side view of one of the crystal plates in the stack at another stage of fabrication in accordance with the same embodiment.

It is certified that error appears in the above-identified patent and that said Letters Patent is hereby corrected as shown below:

Column 2, line 20, "y, and z" should read --$y'$, and $z'$--; line 22, "x-z" should read --$x-z'$--; line 51, "FIG. 1" should read --FIG. 2--. Column 5, line 23, "accordig" should read --according--.

Signed and Sealed this

Seventeenth Day of July 1984

[SEAL]

Attest:

GERALD J. MOSSINGHOFF

Attesting Officer    Commissioner of Patents and Trademarks